United States Patent
Baertsch et al.

[11] 3,969,636
[45] July 13, 1976

[54] CHARGE SENSING CIRCUIT FOR CHARGE TRANSFER DEVICES

[75] Inventors: Richard D. Baertsch, Scotia; Jerome J. Tiemann, Schenectady; William E. Engeler, Scotia, all of N.Y.

[73] Assignee: General Electric Company, Schenectady, N.Y.

[22] Filed: June 30, 1975

[21] Appl. No.: 591,636

[52] U.S. Cl................. 307/235 H; 307/221 D; 307/304; 330/30 D; 307/DIG. 3
[51] Int. Cl.²............................. H03K 5/20
[58] Field of Search........... 307/221 C, 221 D, 304, 307/235 F, 235 V, 235 H, DIG. 3; 330/30 D

[56] References Cited
UNITED STATES PATENTS

| | | | |
|---|---|---|---|
| 3,809,923 | 5/1974 | Esser | 307/221 D |
| 3,877,056 | 4/1975 | Bailey | 307/304 |
| 3,882,326 | 5/1975 | Kruggel | 307/235 F |

*Primary Examiner*—John S. Heyman
*Attorney, Agent, or Firm*—Julius J. Zaskalicky; Joseph T. Cohen; Jerome C. Squillaro

[57] ABSTRACT

In a charge transfer device electrode operating voltage is applied through a high-gain differential amplifier having an inverting and a non-inverting input terminal with capacitive feedback from the output terminal to the inverting terminal. The inverting terminal is connected to the charge transfer device electrode. The non-inverting terminal is connected to a source of operating voltage. During the transfer of charge the voltage on the electrode is maintained substantially constant and a voltage change is produced at the output of the amplifier which is approximately equal to the induced charge divided by the feedback capacitance.

4 Claims, 4 Drawing Figures

CHARGE SENSING CIRCUIT FOR CHARGE TRANSFER DEVICES

The present invention relates to a circuit for energizing the electrodes of charge transfer devices and sensing the flow of charge therein.

The present invention is directed to providing improvements in circuits for sensing the transfer of charge under an electrode or group of interconnected electrodes while maintaining constant voltage on the electrode or electrodes.

An object of the present invention is to provide circuit means for sensing the transfer of charge under an electrode or group of interconnected electrodes which is independent of the capacitance of the electrodes in respect to the substrate.

Another object of the present invention is to provide circuit means for sensing the transfer of signal charge under a group of interconnected electrodes in which cross modulation of signal pick-up in the electrodes of the group is avoided.

In carrying out the invention in an illustrative embodiment thereof there is provided a substrate of one conductivity type semiconductor material and a conductor member insulatingly overlying the substrate. Means are provided for applying a voltage between the conductor member and the substrate to deplete a portion of the substrate underlying the conductor member of majority carriers. Means are provided for introducing charge in the form of minority carriers corresponding to a signal into the depleted portion of the substrate. Means are provided for maintaining the applied voltage substantially constant while sensing the charge induced on the conductor member and includes a high gain differential amplifier having a pair of input terminals and an output terminal. One of the input terminals is an inverting input terminal and the other is a non-inverting input terminal. (A change in voltage at the inverting input terminal in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential). The non-inverting input terminal is connected to the source of the applied voltage. The inverting input terminal is connected to the output terminal through a feedback capacitor and also is connected to the conductor member. When charge is transferred to the conductor member connected to the inverting input terminal, the voltage at this terminal tends to change in a direction corresponding to the polarity of the transferred charge. This tendency, however, causes a large voltage swing in the opposite direction at the output terminal, which in turn drives charge of opposite polarity through the feedback capacitor. The net result is that the total charge, and hence the voltage on the input terminal stays constant. Therefore, the change in voltage developed at the output terminal is proportional to the induced charge on the conductor divided by the feedback capacitance.

The features which are believed to be characteristic of the present invention are set forth with particularity in the appended claims. The invention itself, both as to its organization and method of operation, together with further objects and advantages thereof may best be understood by reference to the following description taken in connection in the accompanying drawings wherein:

Figure 1:
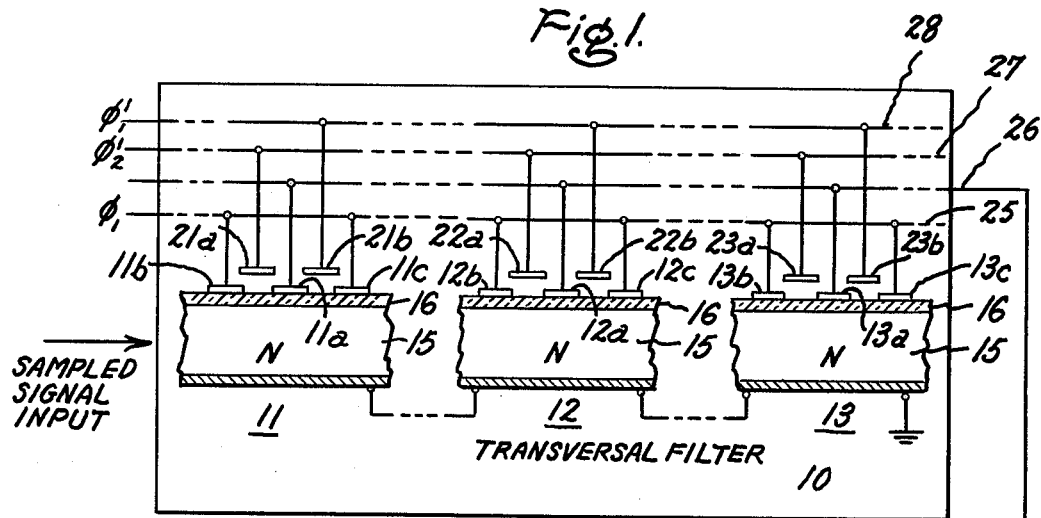
FIG. 1 shows a sectional view of a transversal filter showing a plurality of charge storage and transfer electrodes and circuit means in accordance with the present invention for sensing induced charge on the electrodes.
Figure 3:
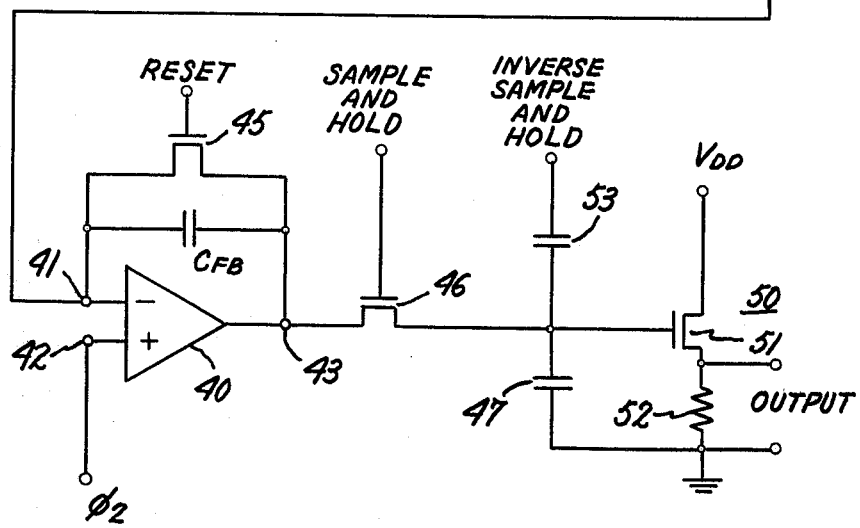
FIG. 3 is a diagram of the differential amplifier circuit of FIG. 1 useful in explaining the manner in which the induced charge is sensed on a clocking line.
Figure 3:
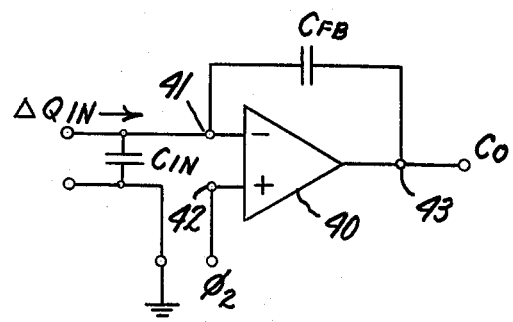

Reference is now made to FIG. 1 which shows a transversal filter 10, such as shown and described in connection with FIG. 3 of U.S. patent application Ser. No. 527,658, filed Nov. 27, 1974 and assigned to the assignee of the present invention which is incorporated herein by reference thereto. Only three segments 11, 12 and 13 of the filter are represented for reasons of clarity to show the manner in which commonly phased electrodes of the transversal filter are interconnected and also to illustrate the manner in which in accordance with the present invention clock voltage is applied to the commonly phased electrodes and charge induced thereon is sensed. The manner in which the charge is introduced into the transversal filter and the manner in which it is removed is not shown as such means do not form any part of this invention and are fully described in the aforementioned patent application.

The filter 10 includes a substrate 15 of N type conductivity semiconductor material overlaid with a layer 16 of insulation on which is provided a plurality of conductive members or electrodes. One group of conductive electrodes 11a, 12a and 13a, referred to as the phase 2 electrodes, are interconnected and connected to the phase 2 line 26 to which a phase 2 clocking voltage $\phi_2$ is applied as will be explained below. Another group of electrodes 11b, 12b, 13b, 11c, 12c, and 13c, referred to as the phase 1 electrodes, are interconnected and connected to the phase 1 line 25 to which a phase 1 clocking voltage $\phi_1$ is applied. Two such phase 1 electrodes are shown for each of the three sections 11, 12 and 13, one on each side of the phase 2 electrodes. A plurality of transfer electrodes or gates 21a, 21b, 22a, 22b, 23a and 23b are provided. Two transfer electrodes are shown on each of the filter sections, one insulatingly overlying the gap between the input side of a phase 2 electrode and the phase 1 electrode adjacent thereto and the other insulatingly overlying the gap on the output side of the phase two electrode and the adjacent phase 1 electrode. Transfer electrodes 21a, 22a, and 23a located on the input side of the phase 2 electrodes are all interconnected and connected to the $\phi_2'$ line 27 to which a $\phi_2'$ clocking voltage is applied. The transfer electrodes 21b, 22b and 23b located on the output side of the phase 2 electrodes are also interconnected and connected to the $\phi_1'$ line 28 to which $\phi_1'$ clocking voltage is applied.

Figure 2:
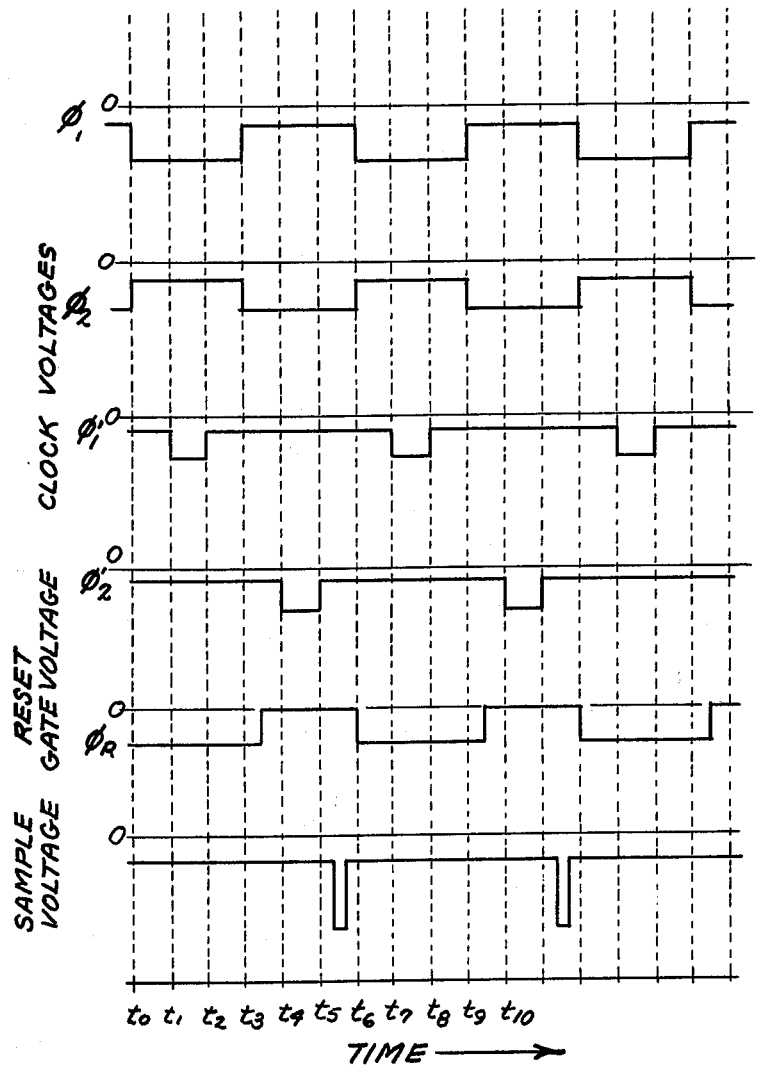
FIG. 2 shows typical voltage waveforms suitable for one mode of operation of the embodiment of the invention set forth in FIG. 1.

In the operation of the filter, packets of charge representing signal samples are serially introduced at the input to the filter and are transferred from stage to stage by the $\phi_1$, $\phi_2$, $\phi_1'$ and $\phi_2'$ clock voltages, such as shown in FIG. 2, applied to the clocking lines 25–28. All or just some of the $\phi_2$ electrodes may be interconnected as shown in the transversal filter of FIG. 3 of the aforementioned patent application SN-527,658. In the circuit of FIG. 3 of the aforementioned patent application the phase two electrodes 46, 48 and 50 are charged to the phase two voltage and floated. The charges transferred into the storage sites underlying the electrodes 46, 48 and 50 produce a change in voltage on the common line connecting these electrodes, is sensed and an output is derived which represents the sum of the signal samples transferred to the storage sites underlying the electrodes. The present invention is directed to providing alternate means for measuring the charge transferred under the storage electrodes and obtaining the sum. In accordance with the present invention the voltage on the phase 2 electrodes is maintained constant while charge is being transferred into the storage sites lying thereunder, and the charge induced on line 26 interconnecting the phase 2 electrodes is sensed to obtain the sum of the signal samples. To this end there is provided a high gain differential amplifier 40 having an inverting input terminal 41 and a non-inverting input terminal 42 and also an output terminal 43. The differential amplifier may be any of a variety of operational amplifiers commercially available for example, operational amplifier LM318 available from National Semiconductor Company of Santa Clara, California. The non-inverting input 41 is connected to a source of $\phi_2$ clock voltage. The output terminal 43 is connected to the non-inverting input terminal 41 through a feedback capacitance $C_{FB}$. A reset switch 45 in the form of a MOSFET transistor is connected across the feedback capacitor $C_{FB}$. A sampling circuit is connected between output terminal 43 and ground, and comprises a MOSFET transistor 46 connected in series with a sampling capacitor 47. The source to drain conduction path of the MOSFET transistor is connected in series with the sampling capacitor 47. The gate electrode of the MOSFET transistor 46 is connected to a source of sampling pulses, such as shown in FIG. 2. The output appearing across the sampling capacitor 47 is applied to a source follower circuit 50 which includes a MOSFET transistor 51, the source-drain conduction path of which is connected in series between a source of operating potential and ground through an output impedance 52. The sampling capacitor is connected between the gate of transistor 51 and ground. A voltage waveform which is the inverse of the sample voltage waveform is applied to sampling capacitor 47 through coupling 53 capacitor to cancel feed through of the sample pulses applied to transistor 46. The manner in which the differential amplifier and associated circuitry enables constant voltage to be applied to the storage electrodes and the manner in which induced charge is measured will be explained in connection with the diagram of FIG. 3. This shows the differential amplifier FIG. 1 in which the entire capacitance of the $\phi_2$ line 26 of the filter is represented by $C_{in}$.

For the high gain differential amplifier with capacitive feedback from the output to the inverting input terminal, the ratio of the incremental change in output voltage $\Delta e_o$ to the incremental change in charge $\Delta Q_{in}$ delivered to the capacitance $C_{in}$ is $$\Delta e_o = \frac{\Delta Q \text{ in.}}{C_{FB}} \tag{1}$$

Thus, any charge delivered to the input capacitance $C_{in}$ produces a voltage change across the output terminal 43 which is approximately equal to the charge delivered divided by the feedback capacitance $C_{FB}$.

The manner in which the circuit of the present invention applies voltage to the sensing electrodes and measures the induced charge in response to the transfer of charge to the storage regions thereunder will now be explained in connection with the wave form diagrams of FIG. 2. The $\phi_1$, $\phi_2$, $\phi_1'$ and $\phi_2'$ voltages are applied, respectively, to lines 25, 42, 28 and 27. Packets of charge representing signal samples are introduced at the input of the transversal filter 10 and are clocked along the surface from stage to stage of the filter. During the interval $t_1$-$t_2$ with the $\phi_1$ voltage and the transfer gate voltage $\phi_1'$ at their most negative values, charge is transferred from the storage sites underlying the $\phi_2$ electrodes to the storage sites underlying the $\phi_1$ electrodes. To a time somewhat after $t_3$ the reset switch 45 is closed thereby shorting out the feedback capacitor $C_{FB}$. As the $\phi_2$ voltage is applied to the non-inverting terminal 42 the voltage on the inverting terminal and the output terminal is also the $\phi_2$ voltage. At instant $t_3$, the $\phi_2$ voltage drops to its most negative value and the $\phi_1$ voltage goes to its least negative value thereby enabling charge to be transferred from $\phi_1$ storage sites to the $\phi_2$ storage sites. The reset switch 45 is opened somewhat after $t_3$, as the reset voltage $\phi_R$ goes to zero at that time and the inverting terminal continues to follow the potential of the non-inverting terminal 42. Charge transfer from the $\phi_1$ to the $\phi_2$ storage sites occurs during the interval $t_4$-$t_5$ when the $\phi_2'$ voltage goes to its most negative value. When surface charge transfers from the $\phi_1$ to the $\phi_2$ sites an opposing charge which is proportional to the transferred charge is induced in the $\phi_2$ line 26. This induced charge is in response to amplifier action in which the feedback capacitance $C_{FB}$ functions to drive the inverting terminal 41 of the amplifier to maintain zero difference in voltage between its potential and the potential on the non-inverting terminal 42 which is connected to the $\phi_2$ voltage source. As pointed out above, the change in output voltage appearing at the output terminals 43 is approximately equal to the charge delivered to the line 26 connecting the $\phi_2$ electrodes divided by the feedback capacitance $C_{FB}$. The output voltage is sampled after the charge transfer has been completed and during the interval between $t_5$-$t_6$ by energizing the MOSFET transistor 46 to charge the sampling capacitor 47 and thereby obtain a sample voltage which is a measure of the charge delivered to the line 26. The sampled voltage is applied to the gate of the source follower 50 from which the output is derived. As some of the sample pulse applied to the gate of transistor 46 may feed through to the source follower, the inverse of the sample voltage is applied to the gate of the source follower 50 to cancel such feedthrough.

Figure 4:
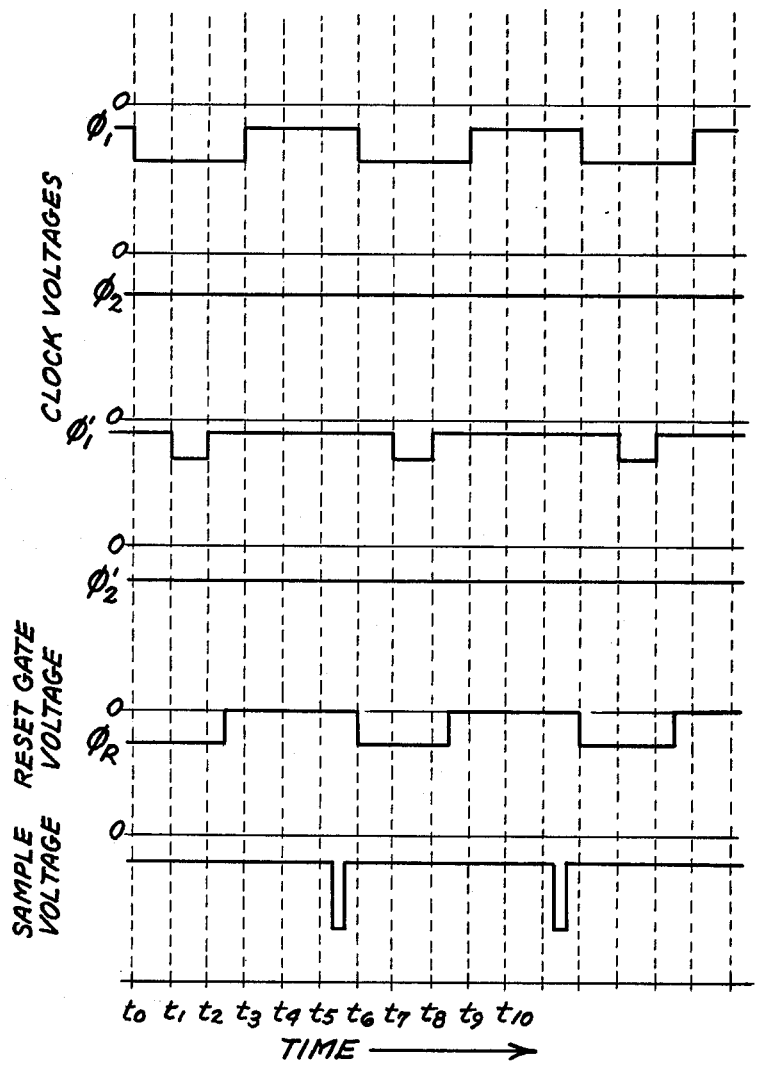
FIG. 4 shows typical voltage waveforms suitable for another mode of operation of the embodiment of FIG. 1.

While the invention has been described in connection with charge transfer apparatus utilizing a two phase system, the invention is particularly applicable to charge transfer apparatus utilizing a clocking system usually referred to as a "one phase"" system in which one group of storage electrodes is maintained at a fixed potential and the other group of storage electrodes is alternately raised to a potential above and below the fixed potential to effect the transfer of charge into and out of the storage regions underlying the electrodes of fixed potential to effect the transfer of charge into and out of the storage regions underlying the electrodes of fixed potential. One such system is described in IEEE Journal of Solid State Circuits, February, 1972, page 92 and 93 in an article entitled "One Phase CCD" by Melan and Meindl. To this end the $\phi_2$ terminal would be connected to a fixed potential lying between the extreme negative values of the $\phi_1$ potential and also the $\phi_2'$ potential would be fixed at a value a little less negative than $\phi_2$ potential to provide directionality of charge transfer to the "one phase" system. Typical voltage waveforms for operation of the filter of FIG. 1 in the "one phase" mode are shown in FIG. 4. An advantage of a one phase system is that the $\phi_2$ line does not change in potential and transient responses in the system are avoided.

While the invention has been described in connection with a particular transversal filter and particular modes of operation thereof, it is apparent that the invention is equally applicable to other modes of operation thereof and to other charge transfer apparatus for sensing charge induced on a line interconnecting a plurality electrodes of charge transfer devices, for example, the correlator of U.S. Pat. No. 3,801,883 and the split electrode transversal filter of U.S. Pat. No. 3,819,958.

We claim as follows:
1. In combination,
a substrate of one conductivity type semiconductor material,
an insulator overlying said substrate,
a conductor member overlying said insulator member,
means for applying a voltage between said conductor member and said substrate to deplete a portion of said substrate underlying said conductor member of majority carriers,
means for introducing charge in the form of minority carriers corresponding to a signal into said depleted portion of said substrate,
means for maintaining said voltage constant while sensing the charge flow into said conductor member including a high gain differential amplifier having a pair of input terminals and an output terminal the voltage at which is responsive to the difference in the voltages at said input terminals, one of said input terminals being an inverting input terminal and the other being a non-inverting terminal, said non-inverting input terminal connected to a source of said voltage, said inverting input terminal connected to said output terminal through a feedback capacitor and also connected to said conductor member,
whereby said conductor member is maintained substantially at said voltage and an output voltage at said output terminal is developed which is proportional to the charge induced on said conductor divided by said feedback capacitor.

2. The combination of claim 1 in which is provided reset means for alternately connecting and disconnecting said inverting terminal and said output terminal during respective first and second intervals of time, and
said means for introducing charge being timed to introduce charge into said depleted portion of said substrate during said second interval when the inverting terminal and said output terminal are not directly connected.

3. The combination of claim 1 in which is provided means for sampling the voltage at the output terminal of said amplifier after the transfer of charge from said introducing means to said depleted portion of said substrate.

4. In combination,
a substrate of one conductivity type semiconductor material,
an insulator overlying said substrate,
a plurality of interconnected conductor members each overlying said insulator member,
means for applying a voltage between said conductor members and said substrate to deplete portions of said substrate underlying said conductor members of majority carriers,
means for introducing charge in the form of minority carriers corresponding to a signal into at least one of said portions,
means for maintaining said voltage constant while sensing the charge induced on said interconnected conductor members including a high gain differential amplifier having a pair of input terminals and an output terminal the voltage at which is responsive to the difference in the voltages at said input terminals, one of said input terminals being an inverting input terminal and the other being a non-inverting input terminal, said inverting terminal connected to said output terminal through a feedback capacitor and also connected to said conductor members,
whereby said conductor members are maintained substantially at said voltage and an output voltage at said output terminal is developed proportional to the charge induced on said conductor member divided by said feedback capacitor.

* * * * *